US012516440B2

(12) United States Patent

Wu et al.

(10) Patent No.: US 12,516,440 B2

(45) Date of Patent: Jan. 6, 2026

(54) INGOT PULLER APPARATUS INCLUDING AUTOMATED CLAMP

(71) Applicant: GlobalWafers Co., Ltd, Hsinchu (TW)

(72) Inventors: Yu-Chiao Wu, Frontenac, MO (US); Ming-Hsien Lai, Hsinchu County (TW)

(73) Assignee: GlobalWafers Co., Ltd., Hsinchu (TW)

( * ) Notice: Subject to any disclaimer, the term of this patent is extended or adjusted under 35 U.S.C. 154(b) by 303 days.

(21) Appl. No.: 18/313,730

(22) Filed: May 8, 2023

(65) Prior Publication Data

US 2024/0376631 A1 Nov. 14, 2024

(51) Int. Cl.

| | |
|---|---|
| ***C30B 15/20*** | (2006.01) |
| ***C30B 15/00*** | (2006.01) |
| ***C30B 35/00*** | (2006.01) |

(52) U.S. Cl.

CPC ............ *C30B 15/007* (2013.01); *C30B 15/20* (2013.01); *C30B 35/005* (2013.01)

(58) Field of Classification Search

CPC ..... C30B 15/007; C30B 15/20; C30B 35/005; Y10T 117/106; Y10T 117/1056

See application file for complete search history.

(56) References Cited

U.S. PATENT DOCUMENTS 5,254,319 A * 10/1993 Oda ........................ C30B 15/00 117/215

6,328,795 B2 * 12/2001 Falster .................... C30B 33/00 117/15

FOREIGN PATENT DOCUMENTS

| | | | |
|---|---|---|---|
| CN | 202578246 U | | 12/2012 |
| CN | 211142235 U | | 7/2020 |
| JP | H0834695 | * | 2/1996 |
| JP | H0834695 A | | 2/1996 |
| KR | 20120000114 A | * | 1/2012 |

OTHER PUBLICATIONS

International Search Report and Written Opinion of the International Searching Authority issued in Serial No. PCT/US2024/025783 mailed on Sep. 19, 2024, pp. 1-32.

KX170MCZ Semiconductor Crystal Growing Furnace Spec Sheet, Linton Crystal Technologies, Oct. 2019, pp. 1-2.

S-Tech Co. Ltd., Turnkey Offer Webpage, www.stech.co.kr/bbs/content.php?co_id-s0301, pp. 1-2.

* cited by examiner

*Primary Examiner* — Robert M Kunemund

(74) *Attorney, Agent, or Firm* — Armstrong Teasdale LLP

(57) ABSTRACT

An ingot puller apparatus includes a housing defining a growth chamber and a growth chamber outlet, an isolation valve having a first valve end connected to the growth chamber outlet and a second valve end, an ingot receiving vessel defining an ingot receiving chamber and a receiving chamber inlet at a receiving vessel end, a clamp including a clamp base connected to the second valve end, and a controller. The clamp includes a clamping mechanism to releasably connect the receiving vessel end to the clamp base and an actuator to cause movement of the clamping mechanism between a clamping position in which the clamping mechanism connects the receiving vessel end to the clamp base, and a releasing position in which the receiving vessel end is releasable from the clamp base. The controller is connected to the actuator to control movement of the clamping mechanism between the clamping and releasing positions.

19 Claims, 7 Drawing Sheets

INGOT PULLER APPARATUS INCLUDING AUTOMATED CLAMP

FIELD

The field relates to ingot puller apparatus used to produce single crystal semiconductor ingots, and more particularly to an automated clamp for selectively connecting an ingot receiving chamber of the ingot puller apparatus to an isolation valve.

BACKGROUND

Single crystal silicon, the starting material for most processes for the fabrication of many electronic components such as semiconductor devices and solar cells, is commonly prepared by batch Czochralski (CZ) or Continuous Czochralski (CCZ) methods. In these methods, a polycrystalline source material, such as polycrystalline silicon ("polysilicon"), in the form of solid feedstock material is charged to a quartz crucible and melted, a single seed crystal is brought into contact with the molten silicon or melt, and a single crystal silicon ingot is grown by slow extraction.

Conventional apparatus that facilitate growth of single crystal silicon ingots include a furnace tank or housing that defines a growth chamber in which the crucible is positioned, an isolation valve connected to an outlet of the growth chamber, and an ingot receiving vessel connected to the isolation valve. During an ingot growth process, the isolation valve is opened to provide communication between the growth chamber and an ingot receiving chamber defined by the ingot receiving vessel. The ingot is grown by the slow extraction in which the growing ingot is pulled out from the growth chamber, through the open isolation valve, and into the ingot receiving chamber. The fully grown ingot is accommodated within the ingot receiving chamber. After the growth process, the isolation valve is closed and the ingot receiving vessel is removed from the isolation valve. The fully grown ingot is then removed from the ingot receiving chamber.

In conventional growth apparatus, the ingot receiving vessel is seated on the isolation valve and connected thereto by a manually operated clamp to maintain the ingot receiving vessel in position and create a seal between the ingot receiving vessel and the isolation valve. To assemble and disassemble the apparatus, an operator is required to manually install the clamp to connect and disconnect the ingot receiving vessel and the isolation valve. This creates the opportunity for operator error and misuse. For example, during assembly, the clamp may not be properly installed resulting in a weak connection and/or leaking seal between the ingot receiving vessel and the isolation valve. Furthermore, use of manually operated clamps to connect the ingot receiving vessel and the isolation valve limits the ability to provide an automated growth process using the apparatus. A need exists for an improved clamp used with ingot growth apparatus that addresses the above-described disadvantages.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, these statements are to be read in this light, and not as admissions of prior art.

SUMMARY

One aspect is an ingot puller apparatus for producing a single crystal semiconductor ingot, the ingot puller apparatus including a housing defining a growth chamber and a growth chamber outlet, an isolation valve having a first valve end connected to the growth chamber outlet and an opposite second valve end, an ingot receiving vessel defining an ingot receiving chamber and a receiving chamber inlet at a receiving vessel end, a clamp including a clamp base connected to the second valve end, and a controller. The clamp includes a clamping mechanism to releasably connect the receiving vessel end to the clamp base, and at least one actuator controllable to cause movement of the clamping mechanism between a clamping position in which the clamping mechanism connects the receiving vessel end to the clamp base, and a releasing position in which the receiving vessel end is releasable from the clamp base. The controller is connected to the at least one actuator to control the at least one actuator to cause movement of the clamping mechanism between the clamping and releasing positions.

Another aspect is an ingot puller apparatus for producing a single crystal semiconductor ingot, the ingot puller apparatus including a housing defining a growth chamber and a growth chamber outlet, an isolation valve having a first valve end connected to the growth chamber outlet and an opposite second valve end, an ingot receiving vessel defining an ingot receiving chamber and a receiving chamber inlet at a receiving vessel end, and a clamp including a clamp base connected to the second valve end. The clamp includes at least one clamping finger to releasably connect the receiving vessel end to the clamp base, the at least one clamping finger pivotably connected to the clamp base, and a support ring moveable relative to the clamp base between a first position and a second position. The support ring urges the at least one clamping finger to pivot into engagement with the receiving vessel end when the support ring moves from the first position to the second position to connect the receiving vessel end to the clamp base.

Another aspect is a releasable clamp for releasably connecting an ingot receiving vessel of an ingot puller apparatus to an isolation valve. The releasable clamp includes a clamp base connectable with an end of the isolation valve, a clamp cover opposite the clamp base, the clamp cover defining an opening sized for receiving an end of the ingot receiving vessel, clamping fingers pivotably connected to the clamp base, and a support ring moveable relative to the clamp base between a first position and a second position. The support ring urges the clamping fingers to pivot into an engaging position adapted for connecting the end of the ingot receiving vessel to the clamp base when the support ring moves from the first position to the second position. The clamp also includes at least one actuator controllable to move the support ring between the first and second positions.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
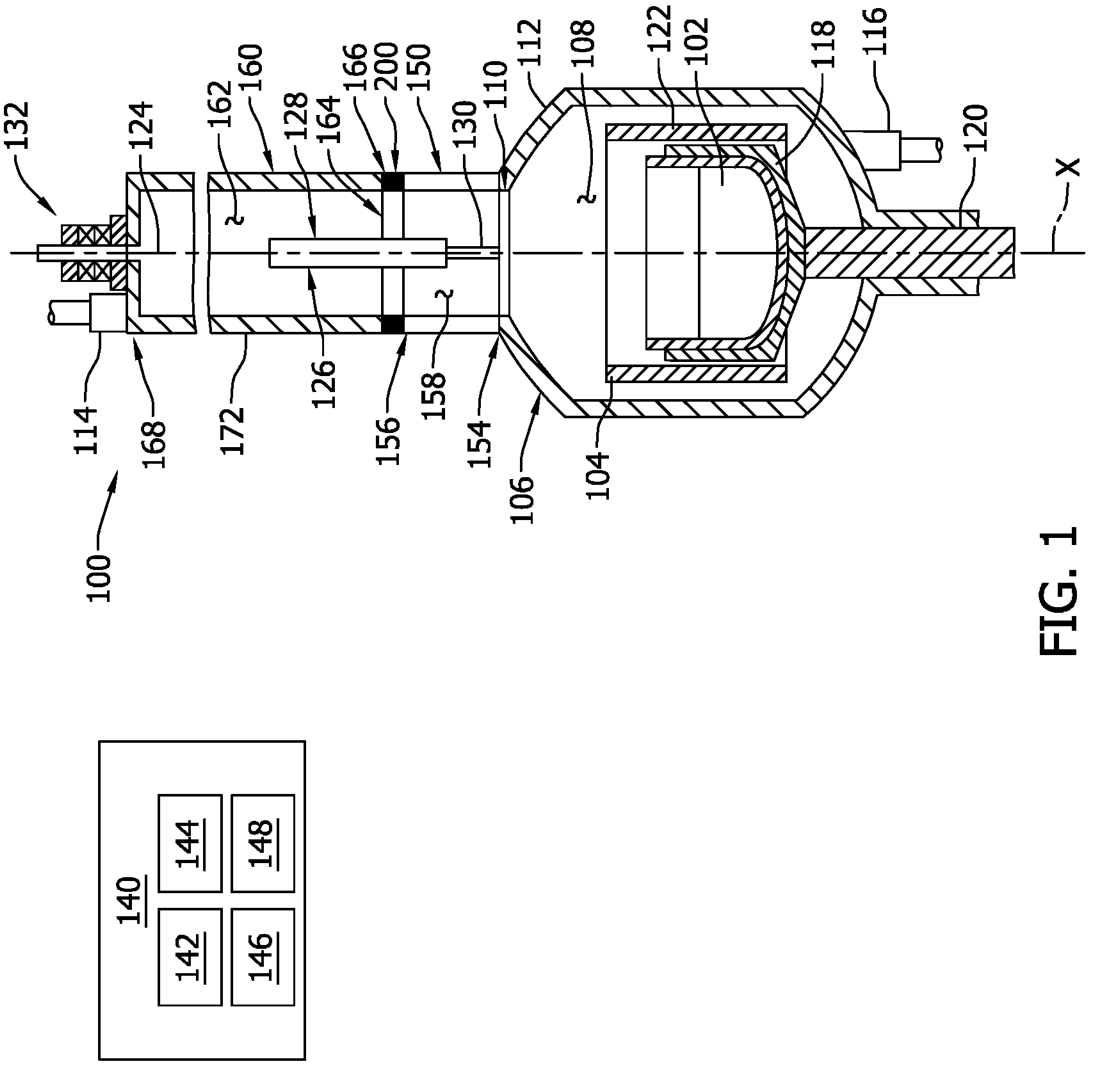
FIG. 1 is a schematic cross section of an ingot pulling apparatus for forming a single crystal silicon ingot.

Referring to FIG. 1, an ingot puller apparatus or ingot puller is shown schematically and is indicated generally at 100. The ingot puller 100 is used to produce single crystal (i.e., monocrystalline) ingots of semiconductor material such as, for example, single crystal silicon ingots. In some embodiments, the ingot is grown by the so-called Czochralski (CZ) process in which the ingot is withdrawn from a silicon melt 102 held within a crucible 104 of crystal puller 100. In some embodiments, the ingot is grown by a batch CZ process in which polycrystalline silicon is charged to the crucible 104 in an amount sufficient to grow one ingot, such that the crucible 104 is essentially depleted of silicon melt 102 after the growth of the one ingot. In other embodiments, the ingot is grown by a continuous CZ (CCZ) process in which polycrystalline silicon is continually or periodically added to crucible 104 to replenish silicon melt 102 during the growth process. The CCZ process facilitates growth of multiple ingots pulled from a single melt 102. Embodiments of the subject matter described are not limited to a particular crystal growth process.

The ingot puller 100 includes a housing 106 that defines a crystal growth chamber 108 and a growth chamber outlet 110 that has a smaller transverse dimension than the growth chamber 108. The housing 106 has a generally dome shaped upper wall 112 transitioning from the growth chamber 108 to the growth chamber outlet 110. The ingot puller 100 includes an inlet port 114 and an outlet port 116 which may be used to introduce and remove a process gas to and from the growth chamber 108 during crystal growth.

The crucible 104 within the ingot puller 100 contains the silicon melt 102 from which a silicon ingot is drawn. The crucible 104 may be made of quartz or fused silica, which has a high melting point and thermal stability and is generally non-reactive with molten silicon in melt 102. The crucible 104 may be made from other materials in addition to quartz without departing from the scope of the present disclosure. For example, the quartz crucible 104 may be made from a composite material that includes silica and an additional material, for example, silicon nitride or silicon carbide.

The silicon melt 102 is obtained by melting polycrystalline silicon charged to the crucible 104. In continuous systems, a feed system (not shown) is used for feeding solid feedstock material into the crucible assembly 104 and/or the melt 102. The crucible 104 is positioned within and supported by a susceptor 118 that is in turn supported by a rotatable shaft 120. Susceptor 118 and rotatable shaft 120 facilitate rotation of the crucible 104 about a central longitudinal axis X of the ingot puller 100.

A heating system 122 (e.g., one or more electrical resistance heaters) surrounds the susceptor 118 and crucible 104 and supplies heat by conduction through the susceptor 118 and crucible 104 for melting the silicon charge to produce the melt 102 and/or maintaining the melt 102 in a molten state. The heater 122 may also extend below the susceptor 118 and crucible 104. The heating system 122 is controlled by a controller 140 so that the temperature of the melt 102 is precisely controlled throughout the pulling process. For example, the controller may control electric current provided to the heating system 122 to control the amount of thermal energy supplied by the heating system 122. The controller may control the heating system 122 so that the temperature of the melt 102 is maintained above about the melting temperature of silicon (e.g., about 1412° C.). For example, the melt 102 may be heated to a temperature of at least about 1425° C., at least about 1450° C. or even at least about 1500° C. Insulation (not shown) surrounding the heating system 122 may reduce the amount of heat lost through the housing 106. The ingot puller 100 may also include a heat shield assembly (not shown) above the surface of melt 102 for shielding the ingot from the heat of the crucible 104 to increase the axial temperature gradient at the solid-melt interface.

A pulling mechanism 132 is attached to a pull wire 124 that extends down from the mechanism. The mechanism 132 can raise and lower the pull wire 124 and rotate the pull wire 124. The ingot puller 100 may have a pull shaft rather than a wire, depending upon the type of puller. The pull wire 124 terminates in a pulling assembly 126 that includes a seed crystal chuck 128 which holds a seed crystal 130 used to grow the silicon ingot.

The ingot puller 100 also includes an isolation valve 150 connected to the housing 106 and, more specifically, to the upper wall 112 at the growth chamber outlet 110. The isolation valve 150 includes a valve body 152 that extends between a first valve end 154 connected to the housing 106 and a second valve end 156. A valve passageway 158 extends through the valve body 152 between the first and second valve ends 154 and 156. The valve body 152 is open at both valve ends 154, 156 such that the valve passageway 158 connects the growth chamber 108 and an ingot receiving chamber 162 defined by an ingot receiving vessel 160. The isolation valve 150 may be opened and closed to selectively provide communication between the growth chamber 108 and the ingot receiving chamber 162. More specifically, the isolation valve 150 includes a valve element 151 (shown in FIG. 3) positioned in the valve passageway 158 that may be selectively actuated, either automatically (e.g., by an actuating arm 153 operably coupled to the valve element 151 and controllable by the controller 140) or manually by an operator using a valve handle (not shown) connected with the valve element, to close or open the valve passageway 158. In the example ingot puller 100, the valve element 151 is a moveable disk that is actuated by the actuating arm 153 (FIG. 3) to selectively seal the second valve end 156, thereby closing the valve passageway 158. In other examples, the isolation valve 150 may include any suitable valve configuration and valve element(s) to enable the isolation valve 150 to function as described. For example, the isolation valve 150 may include a ball valve, a butterfly valve, a diaphragm valve, or any other suitable type of valve. When closed, the isolation valve 150 may suitably isolate the growth chamber 108 from the ingot receiving chamber 162 and/or the ambient environment.

Figure 2:
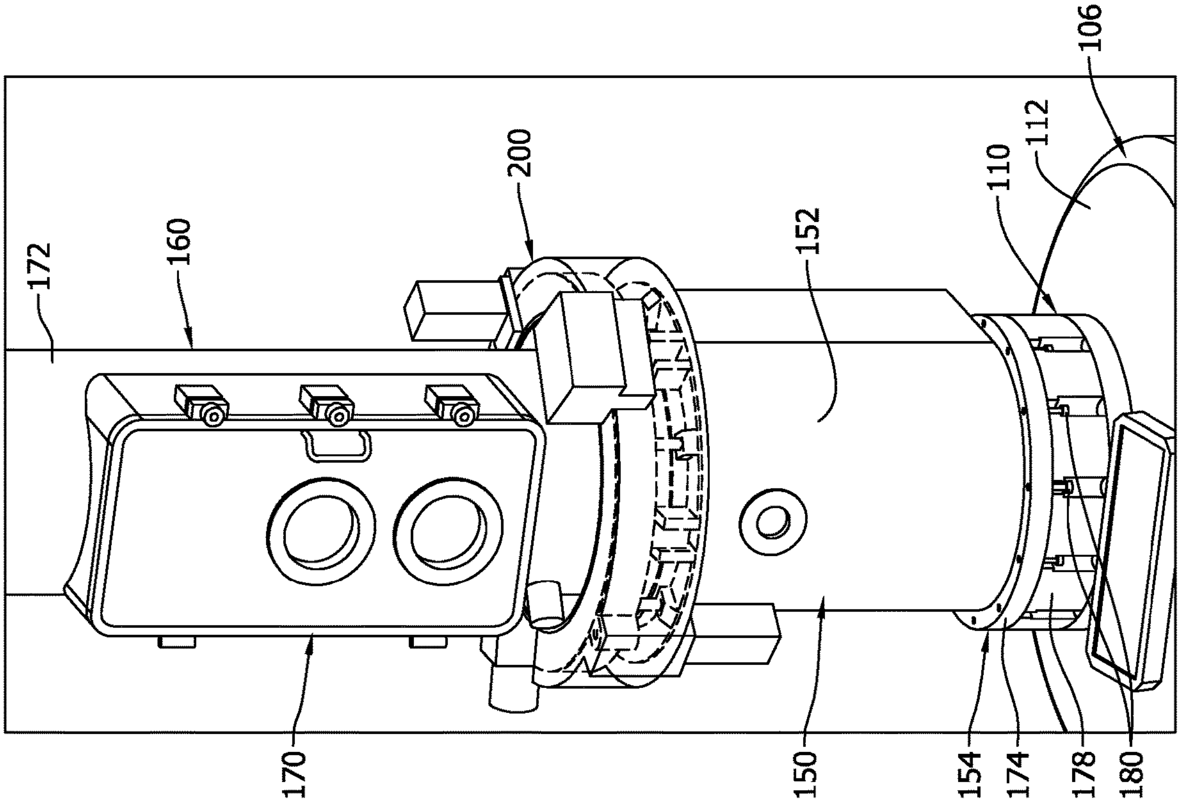
FIG. 2 is a perspective of a portion of the ingot pulling apparatus, depicting an ingot receiving vessel connected to an isolation valve by an example clamp.
Figure 3:
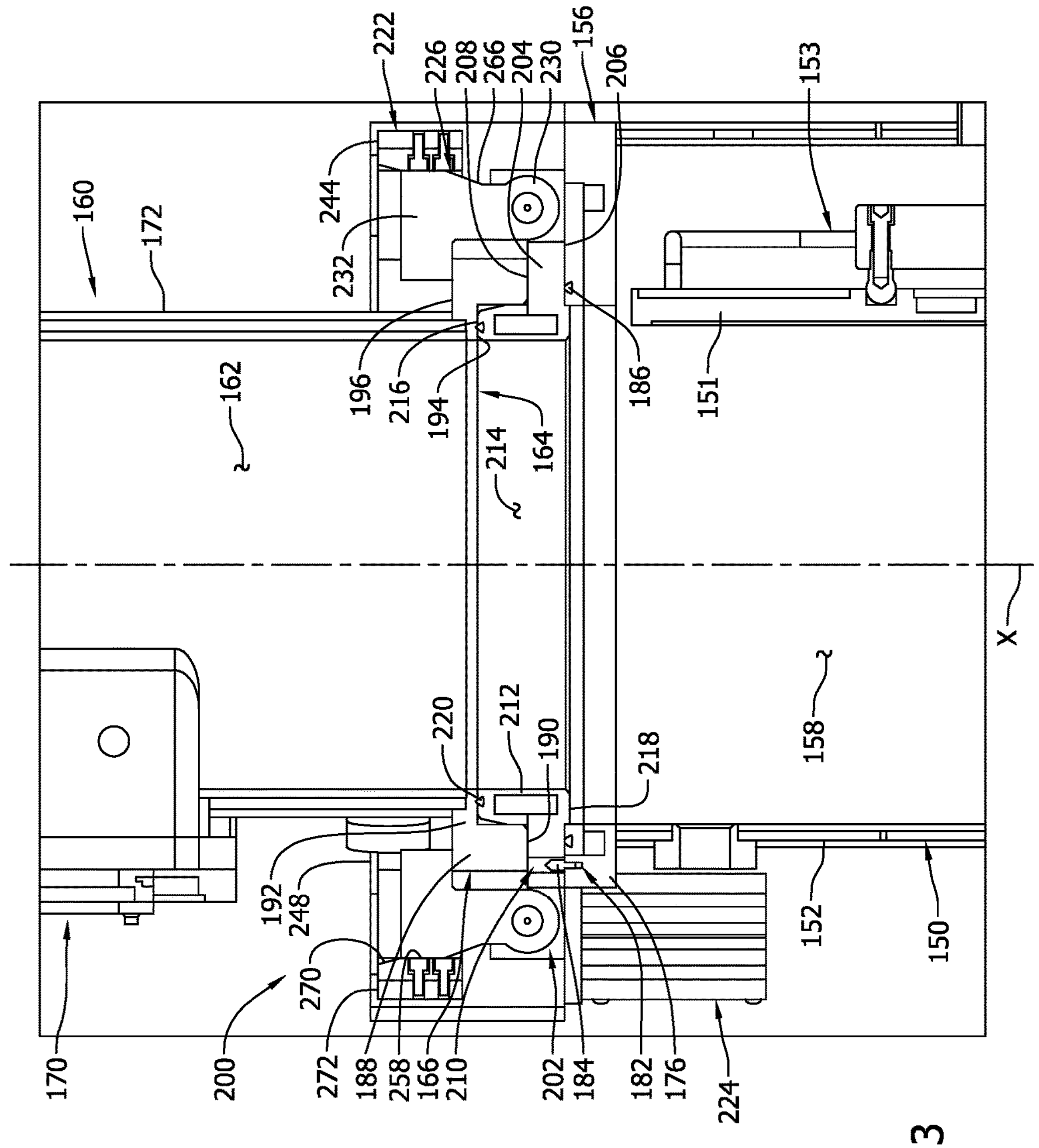
FIG. 3 is a cross section showing the connection between the ingot receiving vessel and the isolation valve facilitated by the example clamp in greater detail.

With additional reference to FIGS. 2 and 3, the valve body 152 of the isolation valve 150 includes flanges 174, 176 at the open valve ends 154, 156, respectively. The flanges 174, 176 enable connection of the isolation valve 150 to the housing 106 and a clamp 200, respectively. The clamp 200 will be described in further detail below. As shown in FIG. 2, an annular joining collar 178 is provided between the upper wall 112 of the housing 106 at the growth chamber outlet 110 and the second valve end 154. The flange 174 is connected to the joining collar 178 using fasteners 180 (e.g., bolts and/or screws) to connect the first valve end 154 and the growth chamber outlet 110.

Referring again to FIG. 1, the ingot receiving vessel 160 includes a hollow cylinder that defines the ingot receiving chamber 162. The ingot receiving vessel 160 is open at a first vessel end 166 to define a receiving chamber inlet 164. The ingot receiving vessel 160 extends from the first vessel end 166 to a second vessel end 168. The ingot receiving vessel 160 includes a door 170 (shown in FIG. 2) located on a sidewall 172 of the receiving vessel 160 that extends between the first and second vessel ends 166 and 168. When the ingot puller 100 is assembled during a growth process, the first vessel end 166 is connected to the second valve end 156 using the clamp 200, described in further detail below. The receiving vessel 160 extends vertically above the isolation valve 150 and the housing 106 in coaxial alignment with the valve passageway 158 and the growth chamber outlet 110. More specifically, the receiving vessel 160, the isolation valve 150, and the growth chamber outlet 110 are axially aligned along the longitudinal axis X of the ingot puller 100 to enable the growing ingot to be pulled out of growth chamber 108 through the growth chamber outlet 110, through the valve passageway 158, and into the ingot receiving chamber 162. The receiving vessel 160 extends a suitable height between the first and second vessel ends 166 and 168 to accommodate the entire length of the fully grown ingot and the pulling assembly 126. The door 170 located on the sidewall 172 of the ingot receiving vessel 160 is sized and shaped to provide a lateral exit for the fully grown ingot from the receiving chamber 162.

A process gas (e.g., argon) is introduced through the inlet port 114 into the growth chamber 108 and is withdrawn through the outlet port 116. The inlet port 114 is shown in FIG. 1 positioned at the second vessel end 168 to introduce process gas through the ingot receiving chamber 162 and the open valve passageway 158 towards the growth chamber 108. In other examples, the inlet port 114 may be located at an additional or alternative suitable position in the ingot puller 100 (e.g., on the upper wall 112 of the housing 106). The process gas creates an atmosphere within the housing and the melt and atmosphere form a melt-gas interface. The outlet port 116 is in fluid communication with an exhaust system (not shown) of the ingot puller.

The controller 140 may be any known computing device or computer system and includes one or more processors 142 and a memory area 144. The processor 142 executes instructions stored in the memory area 144. The term "processor" refers to central processing units, microprocessors, microcontrollers, reduced instruction set circuits (RISC), application specific integrated circuits (ASIC), logic circuits, and any other circuit or processor capable of executing the functions described. The above are examples only and are thus not intended to limit in any way the definition and/or meaning of the term "processor." In addition, one or more processors 142 may be in one computing device or a plurality of computing devices acting in parallel.

Stored in the memory area 144 are, for example, processor-executable instructions for receiving and processing input received from an operator (e.g., via a user interface 146) and controlling process parameters of the ingot puller 100 based on the processed input received from the operator. The memory area 144 may include, but is not limited to, any computer-operated hardware suitable for storing and/or retrieving processor-executable instructions and/or data. The memory area 144 may include random access memory (RAM) such as dynamic RAM (DRAM) or static RAM (SRAM), read-only memory (ROM), erasable programmable read-only memory (EPROM), electrically erasable programmable read-only memory (EEPROM), and nonvolatile RAM (NVRAM). Further, the memory area 144 may include multiple storage units such as hard disks or solid-state disks in a redundant array of inexpensive disks (RAID) configuration. The memory area 144 may include a storage area network (SAN) and/or a network attached storage (NAS) system. In some embodiments, the memory area 144 includes memory that is integrated in controller 140. For example, the controller 140 may include one or more hard disk drives as the memory area 144. The memory area 144 may also include memory that is external to the controller 140 and may be accessed by a plurality of computing devices. The above memory types are for example only and are thus not limiting as to the types of memory usable for storage of processor-executable instructions and/or data.

The controller 140 also includes a user input device or user interface 146 for receiving input from an operator. The information may be one or more selected process parameters or control actions for an ingot growth process. The input device 146 may include, for example, a keyboard, a pointing device, a mouse, a stylus, a touch sensitive panel (e.g., a touch pad or a touch screen), an audio input device, and the like. A single component such as a touch screen may function as both an output device of the controller 140 (e.g., a media output component) and the input device 146. For example, the memory area 144 may store computer-readable instructions for providing the user interface 146 to a user via media output component and for receiving and processing input from the user interface 146. The user interface 146 may include, among other possibilities, a web browser and an application. Web browsers enable users to display and interact with media and other information typically embedded on a web page or a website from a web server. An application allows users to interact with a server application. The user interface, via one or both of a web browser and an application, facilitates display of information related to the ingot puller 100 and the ingot growth process.

The controller 140 may also include a communication interface 148, which may be communicatively connected to one or more remote devices. The communication interface 148 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

During operation of the ingot puller 100 to grow an ingot, the first vessel end 166 of the ingot receiving vessel 160 is connected to the second valve end 156 of the isolation valve 150 using the clamp 200. The isolation valve 150 is opened at this stage to provide communication between the growth chamber 108, the valve passageway 158, and the ingot receiving chamber 162. Polycrystalline silicon material is charged to the crucible 104 and heated by the heating system 122 to produce the silicon melt 102. Process gas is introduced into the growth chamber 108 through the inlet port 114, the ingot receiving chamber 162, and the valve passageway 158. The pulling mechanism 132 lowers the seed crystal 130 through the ingot receiving chamber 162 and the valve passageway 158 and into the growth chamber 108 until the seed crystal 130 contacts the surface of the silicon melt 102. Once the seed crystal 130 begins to melt, the pulling mechanism 132 slowly raises the seed crystal 130 up, in a direction of longitudinal axis X, through the growth chamber 108 to grow the single crystal ingot. The speed at which the pulling mechanism 132 rotates the seed crystal 130 and the speed at which the pulling mechanism 132 raises the seed crystal (i.e., the pull rate v) are controlled by the controller 140.

As the seed crystal 130 is slowly raised from the melt 102, silicon atoms from the melt 102 align themselves with and attach to the seed crystal 130 to form an ingot. The pulling mechanism 132 continues to raise the seed crystal 130 and the growing ingot in the direction of the longitudinal axis X, out of the growth chamber 108 through the growth chamber outlet 110 and into the ingot receiving chamber 162 through the valve passageway 158.

After the ingot is grown a suitable length, the growth process terminates and the fully grown ingot is accommodated within the receiving chamber 162. The isolation valve 150 is subsequently closed (either manually or via the controller 140) and the clamp 200 is opened to release the ingot receiving vessel 160 from the isolation valve 150. The ingot receiving vessel 160 is removed from the isolation valve 150 and the ingot is subsequently removed from the receiving chamber 162 via the door 170.

Figure 4:
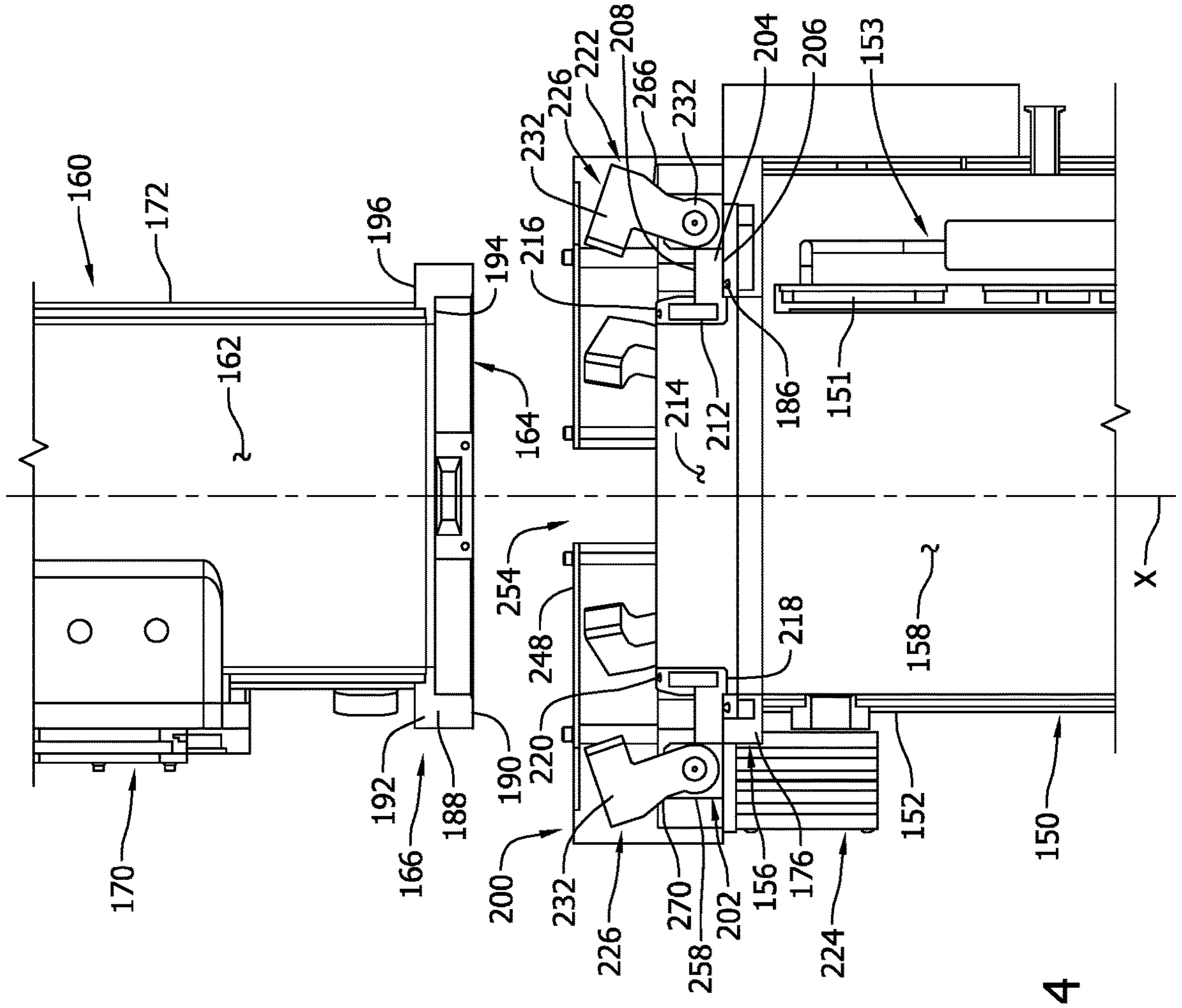
FIG. 4 is a cross section showing the ingot receiving vessel released from the isolation valve when the clamp is opened.
Figure 5:
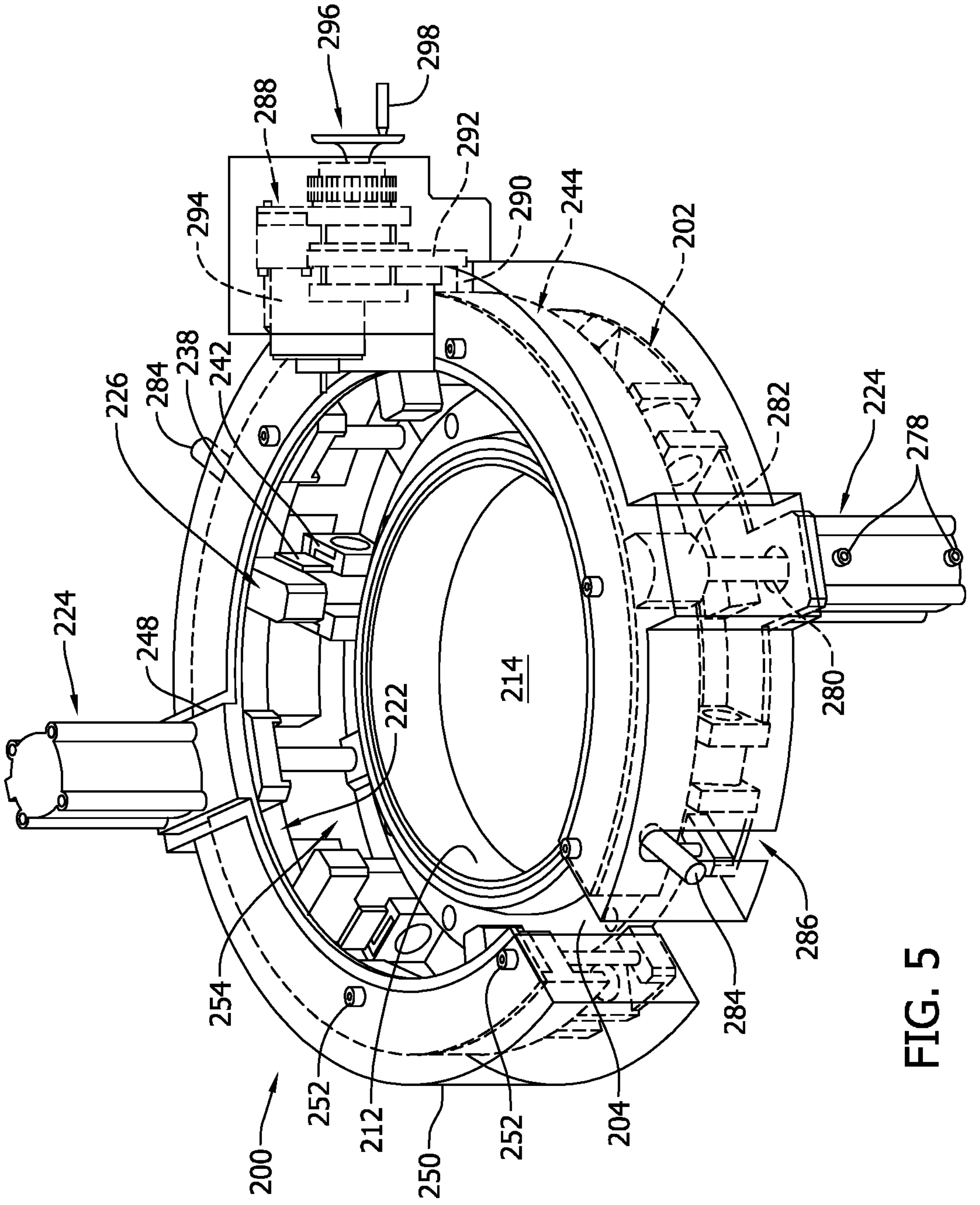
FIG. 5 is an isolated perspective of the clamp.
Figure 6:
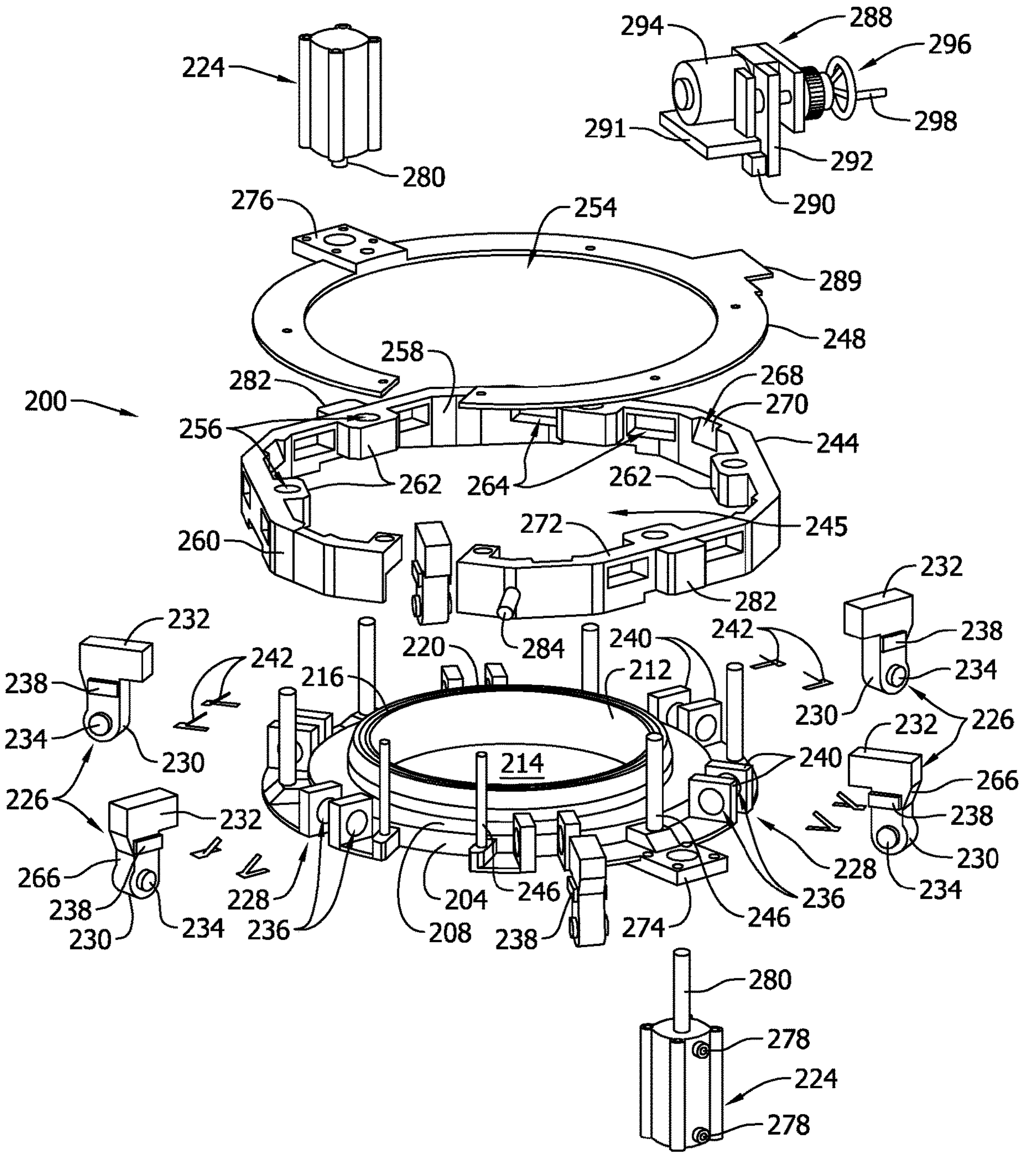
FIG. 6 is an exploded view of the clamp.

The example clamp 200 for releasably connecting the ingot receiving vessel 160 to the isolation valve 150 will now be described with reference to FIGS. 2-5. FIG. 2 is a perspective of a portion of the ingot receiving vessel 160 connected to the isolation valve 150 by the clamp 200. FIG. 3 is a cross section showing the connection between the ingot receiving vessel 160 and the isolation valve 150 facilitated by the clamp 200 in greater detail. FIG. 4 is a cross section showing the ingot receiving vessel 160 released from the isolation valve 150 when the clamp 200 is opened. FIG. 5 is an isolated perspective of the clamp 200. FIG. 6 is an exploded view of the clamp 200.

The clamp 200 includes a clamp base 202, a clamp cover 248 opposite and raised relative to the clamp base 202, and a clamp housing 250 connected to the clamp cover 248 by fasteners 252 (e.g., screws). The clamp housing 250 is omitted from FIG. 6. The clamp cover 248 and the clamp housing 250 define a clamp opening 254 sized and shaped to receive the first vessel end 166 of the ingot receiving vessel 160. The clamp base 202 is connected to the second valve end 156. The clamp base 202 includes a base platform 204 that is sized and shaped to complement the size and shape of the flange 176 at the second valve end 156. In the example shown, the base platform 204 is annular in shape. In other examples, the base platform 204 may have any suitable shape to complement a shape of the flange 176.

The base platform 204 includes a bottom surface 206 that is seated on the flange 176 and an opposite top surface 208. Holes 210 extend through the base platform 204 between the top surface 208 and the bottom surface 206. The holes 210 align with corresponding apertures 182 defined in the flange 176. The holes 210 and the corresponding apertures 182 receive fasteners 184 (e.g., dowels, screws, bolts, and the like) to connect the base platform 204 to the flange 176 and, thereby, to connect the clamp base 202 to the second valve end 156. An o-ring 186 is provided between the bottom surface 206 and the flange 176. In the example shown, the o-ring 186 is seated within a recess (not labeled) extending along the flange 176. Additionally or alternatively, a recess may be formed in the bottom surface 206 of the base platform 204 to accomodate the o-ring 186. When the base platform 204 is connected to the flange 176, the o-ring 186 creates a seal between the bottom surface 206 and the flange 176.

The clamp base 202 also includes an annular wall 212 extending from the top surface 208 of the base platform 204 to an upper edge 216. The annular wall 212 also depends downward beyond the bottom surface 206 of the base platform 204 to define an annular ridge 218. The ridge 218 is received by the open second valve end 156 and facilitates aligning the bottom surface 206 of the base platform 204 on the flange 176. The annular wall 212 circumscribes and defines a central opening 214 in the clamp base 202. The annular wall 212 defines a suitable diameter of the central opening 214 to allow an ingot to pass therethrough and clear the annular wall 212. Moreover, when the ingot puller 100 is assembled with the clamp 200 connecting the isolation valve 150 and the ingot receiving vessel 160, the central opening 214 is in axial alignment with the growth chamber outlet 110, the valve passageway 158, and the receiving chamber 162 along the longitudinal axis X of the ingot puller 100 to enable the ingot to be pulled through the central opening 214 into the receiving chamber 162.

The clamp base 202 supports the ingot receiving vessel 160 received by the clamp opening 254 and is located between the first vessel end 166 and the second valve end 156. The first vessel end 166 includes a rim 188 that depends downward from the sidewall 172 to a bottom edge 190. The rim 188 circumscribes and defines the receiving chamber inlet 164. The rim 188 is joined to the sidewall 172 by a shoulder 192 that extends transversely between the rim 188 and the sidewall 172. The shoulder 192 defines an interior ledge 194 extending between interior surfaces of the rim 188 and the sidewall 172 and an exterior ledge 196 extending between exterior surfaces of the rim 188 and the sidewall 172.

As shown in FIG. 3, when the ingot receiving vessel 160 is supported on the clamp base 202, the annular wall 212 is received by the rim 188 and the upper edge 216 of the annular wall 212 engages the interior ledge 194. An o-ring 220 is provided between the upper edge 216 and the interior ledge 194. In the example shown, the o-ring 220 is seated within a recess (not labeled) extending along the upper edge 216. Additionally and/or alternatively, a recess may be formed in the interior ledge 194 to receive the o-ring 220. When the ingot receiving vessel 160 is supported on the clamp base 202 and the annular wall 212 engages the interior ledge 194, the o-ring 220 creates a seal between the upper edge 216 and the interior ledge 194.

Additionally, as shown in FIG. 3, when the ingot receiving vessel 160 is supported on the clamp base 202 and the annular wall 212 is received by the rim 188, the bottom edge 190 of the rim 188 engages the top surface 208 of the base platform 204. The top surface 208 extends a suitable distance between the annular wall 212 and a peripheral portion or periphery of the clamp base 202 such that the rim 188 does not extend outward beyond the base platform 204. An o-ring (not shown) may be provided between the bottom edge 190 and the top surface 208 of the base platform 204 to create a seal therebetween. In some examples, the upper edge 216 of the annular wall 212 may engage the interior ledge 194 while the bottom edge 190 does not engage the top surface 208 of the base platform 204. In other examples, the upper edge 216 of the annular wall 212 may not engage the interior ledge 194 while the bottom edge 190 engages the top surface 208 of the base platform 204. Suitably, at least one o-ring is provided to create a seal between the clamp base 202 and the first vessel end 166. In examples where there is only one engagement interface between the clamp base 202 and the first vessel end 166 (i.e., between the upper edge 216 of the annular wall 212 and the interior ledge 194 or between the bottom edge 190 and the top surface 208 of the base platform 204), an o-ring or other seal is suitably provided at the engagement interface.

The clamp 200 also includes a clamping mechanism 222 for releasably connecting the first vessel end 166 received by the clamp opening 254 to the clamp base 202. The clamping mechanism 222 is moveable relative to the clamp base 202 between a clamping position, in which the clamping mechanism 222 connects the first vessel end 166 to the clamp base 202 (shown in FIG. 3), and a releasing position, in which the first vessel end 166 is releasable from the clamp base 202 (shown in FIG. 4). The clamping mechanism 222 is operably connected to one or more actuators 224 that cause movement of the clamping mechanism 222 between the clamping and releasing positions. The one or more actuators 224 may be automatically controlled by a controller (e.g., the controller 140 shown in FIG. 1) to cause movement of the clamping mechanism 222.

The clamping mechanism 222 includes clamping fingers 226 that are pivotably connected to the clamp base 202. The clamp base 202 includes pairs of mounting brackets 228 disposed at discrete positions along a periphery of the clamp base 202 beyond the base platform 204. Each clamping finger 226 is connected to the clamp base 202 via a respective pair of mounting brackets 228. In the example clamp 200, the clamping mechanism 222 includes six clamping fingers 226 and six corresponding pairs of mounting brackets 228 disposed at the discrete positions along the periphery of the clamp base 202. The clamping mechanism 222 may alternatively include any suitable number of clamping fingers 226 and corresponding pairs of mounting brackets 228. For example, the clamping mechanism 222 may include one clamping finger 226 and one corresponding pair of mounting brackets 228, or two or more (e.g., two, three, four, five, or more than six) clamping fingers 226 and two or more (e.g., two, three, four, five, or more than six) corresponding pairs of mounting brackets 228. In some examples, each clamping finger 226 may be pivotably connected to the clamp base 202 by a single corresponding mounting bracket 228.

The clamping fingers 226 each include a pivot base 230 and a head 232 that protrudes outward beyond the pivot base 230. The pivot base 230 of each clamping finger 226 includes a shaft 234 extending therethrough and laterally outward from opposing sides of the clamping finger 226. The shaft 234 is inserted into a pair of holes 236 formed in the respective pair of mounting brackets 228 to pivotably connect the pivot base 230 between the mounting brackets 228. Each clamping finger 226 is pivotable by rotation of the shaft 234 within the pair of holes 236 about a pivot axis extending through the respective shaft 234 in a direction tangential to the periphery of the clamp base 202. Retaining elements (e.g., nuts, washers, and the like) may be provided to maintain the shaft 234 within the pair of holes 236 while the clamping finger 226 pivots between the pair of mounting brackets 228.

The clamping fingers 226 are pivotable between an idle position (shown in FIG. 4), corresponding to the releasing position of the clamping mechanism 222 in which the first vessel end 166 is releasable from the clamp base 202, and an engaging position (shown in FIG. 3), corresponding to the clamping position of the clamping mechanism 222 in which the clamping mechanism 222 connects the first vessel end 166 to the clamp base 202. In the engaging position, the outward-protruding head 232 of each clamping finger 226 extends over and engages the exterior surface 196 defined by the shoulder 192 of the ingot receiving vessel 160. The engagement between the heads 232 and the exterior surface 196 facilitates connecting the first vessel end 166 to the clamp base 202. In the idle position, the clamping fingers 226 are oriented at an oblique angle relative to the longitudinal axis X such that the exterior surface 196 and the rim 188 of the ingot receiving vessel 160 clears the heads 232 and the ingot receiving vessel 160 may be released from the clamp base 202 (e.g., by an upward pulling force applied to the ingot receiving vessel 160).

The clamping mechanism 222 also includes biasing elements 242 (shown in FIG. 6) that maintain the clamping fingers 226 in and/or urge the clamping fingers 226 to pivot towards the idle position (shown in FIG. 4). In the example clamp 200, the biasing elements 242 are spring clips. Each spring clip 242 includes a stationary portion connected to a top surface 240 of a respective mounting bracket 228 and a deflecting portion moveable relative to the stationary portion. The deflecting portion of each spring clip 242 is connected to a clamping finger 226. In particular, each clamping finger 226 includes a pair of tabs 238 extending laterally outward from the opposing sides of the clamping finger 226, and the deflecting portion of each spring clip 242 is connected to one of the tabs 238. In an idle or resting state, in which no external force is applied to the clamping fingers 226 and/or the spring clips 242, the deflecting portion of each spring clip 242 is at an oblique angle relative to the stationary portion (as shown in FIG. 6), which translates to the clamping fingers 226 being oriented in the idle position shown in FIG. 4. The deflecting portion of each spring clip 242 is moveable to a position substantially flush with the stationary portion (not shown) in response to an external force that urges the clamping fingers 226 to pivot towards the base platform 204 into the engaging position shown in FIG. 3. When the applied external force is released from the clamping fingers 226, the deflecting portion of each spring clip 242 deflects back to the idle or resting state shown in FIG. 6. The deflecting portion thereby urges the clamping fingers 226 to pivot back towards the idle position shown in FIG. 4.

The clamping mechanism 222 also includes a support ring 244 moveable relative to the clamp base 202 to selectively apply a force to the clamping fingers 226 that urges the clamping fingers 226 to pivot towards the engaging position. The support ring 244 is slidingly connected to guide rails 246. The guide rails 246 are connected to the clamp base 202 at discrete positions along the periphery of the clamp base 202 beyond the base platform 204. The guide rails 246 extend substantially parallel to one another between the clamp base 202 and the clamp cover 248. The clamp cover 248 is also connected to each guide rail 246 (e.g., using the fasteners 252 that connect the clamp cover 248 and the clamp housing 250) at positions corresponding to the guide rail positions on the clamp base 202. The guide rails 246 are inserted through holes 256 in the support ring 244 to slidingly connect the support ring 244 thereto. The support ring 244 is annularly-shaped and defines a ring opening 245 that is suitably sized to provide clearance for the first vessel end 166 of the ingot receiving vessel 160 received by the clamp opening 254. Thereby, ingot receiving vessel 160 does not interfere with movement of the support ring 244 along the guide rails 246 between the clamp base 202 and the clamp cover 248.

The support ring 244 includes an inner surface 258 and an outer surface 260. Projections 262 extend inward from the inner surface 258. The holes 256 for respectively receiving the guide rails 246 extend through the projections 262. The support ring 244 also includes windows 264 extending therethrough between the inner surface 258 and the outer surface 260. The windows 264 are provided to receive one or more retaining pins 290, described in further detail below, and/or to reduce a weight of the support ring 244.

The support ring 244 surrounds the clamping fingers 226. As the support ring 244 moves between the clamp base 202 and the clamp cover 248, the inner surface 258 of the support ring 244 works against a back surface 266 of each clamping finger 226 to urge the clamping fingers 226 to pivot towards the engaging position (shown in FIG. 3). The back surface 266 of the clamping finger 226 and the outward-protruding head 232 define a "S" clamping finger profile. As shown in FIGS. 3 and 4, the back surface 266 of each clamping finger 226 transitions from a concave surface portion adjacent the pivot base 230 to a flat surface portion adjacent the head 232. The support ring 244 includes tapered slots 268 defined in the inner surface 258 thereof at locations corresponding to the clamping fingers 226. The tapered slots 268 define an angled surface 270 extending between a top surface 272 of the support ring 244 and the inner surface 258. Each angled surface 270 complements the concave portion of the back surface 266 of a respective clamping finger 226 and limits or eliminates engagement between the support ring 244 and the clamping finger 226 when the support ring 244 is in a first, lowered position adjacent the clamp base 202 (shown in FIG. 4).

When the support ring 244 is in the first position adjacent the clamp base 202, the clamping fingers 202 are maintained in the idle position by the spring clips 242. As the support ring 244 is moved from the first position towards a second, raised position adjacent the clamp cover 248 (shown in FIG. 3), engagement between the support ring 244 and clamping fingers 226 gradually increases. As the support ring is moved towards the second position, the angled surface 270 engages the flat surface portion of the back surface 266 of a respective clamping finger 226, urging the clamping finger 226 to pivot towards the engaging position. As movement of the support ring 244 towards the second position continues, the engagement transitions to the inner surface 258 engaging the flat surface portion of the back surface 266 of each clamping finger 226. At this stage, each clamping finger 226 is in the engaging position.

The one or more actuators 224 of the clamp 200 are controllable to cause movement of the support ring 244 between the first and second positions, which respectively translate to the clamping fingers 226 being in the idle and engaging positions, and the clamping mechanism 222 being in the releasing and engaging positions. In the example clamp 200, the one or more actuators 224 are pneumatic cylinders. In other examples, any suitable actuator may be used as the one or more actuators 224 to enable the clamp 200 to function as described.

For example, the one or more actuators 224 may include linear actuators, rotary actuators, hydraulic cylinders, electric actuators, and the like. The one or more actuators 224 include two actuators 224 in the example clamp 200. In other examples, more or fewer actuators 224 may be included to enable the clamp 200 to function as described. The actuators 224 are connected to a controller (e.g., the controller 140 shown in FIG. 1). The controller 140 controls the one or more actuators to cause movement of the support ring 244 between the first and second positions. The one or more actuators 224 may be referred to as two pneumatic cylinders 224, but this is for ease of description and does not limit the actuators 224 to any number or type of actuator.

In the example clamp 200, the pneumatic cylinders 224 are located on opposite sides of the clamp 200 to apply a balanced force to the support ring 244. One of the pneumatic cylinders 224 is connected to the clamp base 202 at a base actuator mount 274 and the other of the pneumatic cylinders 224 is connected to the clamp cover 248 at a cover actuator mount 276. Each pneumatic cylinder 224 is connected to a pressurized gas (e.g., compressed air) supply (not shown) via gas ports 278. Each pneumatic cylinder 224 also includes a piston 280 that extends or retracts in response to compressed air supplied or removed from the pneumatic cylinder 224. The pistons 280 are connected to the support ring 244 at piston mounts 282 extending from the outer surface 260 of the support ring 244 at opposite sides of the support ring 244 corresponding to the locations at which the pneumatic cylinders 224 are located. As the pistons 280 extend or retract, the support ring 244 is moved between the first and second positions. The controller 140 may control movement of the support ring 244 by controlling the compressed air supplied or removed from the pneumatic cylinders to selectively extend or retract the pistons 280. Movement of the support ring 244 between the first and second positions may additionally or alternatively be manually controlled by an operator via one or more bars 284 extending outward from the outer surface 260 of the support ring 244.

As shown in FIG. 5, the bars 284 extend outward beyond the clamp housing 250 to enable an operator to access and grasp the bars 284. Slots 286 are defined in the clamp housing 250 that extend between the clamp base 202 and the clamp cover 248 to provide clearance for the bars 284 as the support ring 244 is moved between the first and second positions. The operator may move the support ring 244 from the first position towards the second position by applying an upward pulling force on the bars 284, and may move the support ring 244 from the second position towards the first position by applying a downward pushing force on the bars 284.

The clamp 200 also includes a retaining pin assembly 288 that facilitates selectively maintaining the support ring 244 in the second position. The retaining pin assembly 288 is mounted to the clamp cover 248 by a mounting platform 291 connected to a retaining pin mount 289 on the clamp cover 248 (e.g., using fasteners). The retaining pin assembly 288 includes a retaining pin 290 that is selectively translatable into and out from one of the windows 264 in the support ring 244. The retaining pin 290 is operably connected to a motor 294 (e.g., a pneumatic actuator or an electrically controllable actuator including, but not limited to, an electric motor, a servo motor, a stepper motor, and the like) via a plate 292. The motor 294 is mounted on the mounting platform 291. The motor 294 operates to cause linear movement of the plate 292 relative to the motor 294 and the mounting platform 291. Linear movement of the plate 292 translates the retaining pin 290 into or out from the one of the windows 264. The motor 294 may be connected with a controller (e.g., the controller 140). The controller 140 may control the motor 294 to cause translational movement of the retaining pin 290 into or out from the one of the windows 264.

Additionally or alternatively, the retaining pin assembly 288 may include a manual gear drive 296 operably connected to the plate 292 that enables an operator to manually cause translational movement of the retaining pin 290 into or out from the one of the windows 264. The manual gear drive 296 includes a manual drive wheel 298. Rotation of the manual drive wheel 298 (e.g., by an operator) is translated by the manual gear drive 296 to linear movement of the plate 292 and translational movement of the retaining pin 290. When the retaining pin 290 is selectively inserted into the one of the windows 264, using the motor 294 and/or the manual gear drive 296, the retaining pin 290 facilitates maintaining the support ring 244 in the second position by limiting or preventing the support ring 244 from moving (i.e., lowering) to the first position.

Figure 9:
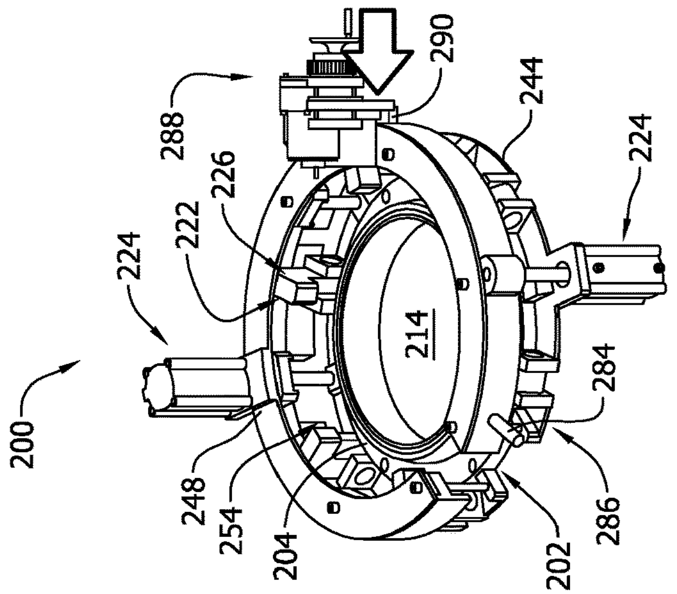
FIGS. 7-9 are isolated perspectives of the clamp and illustrate steps in a sequence of operating the clamp.
Figure 8:
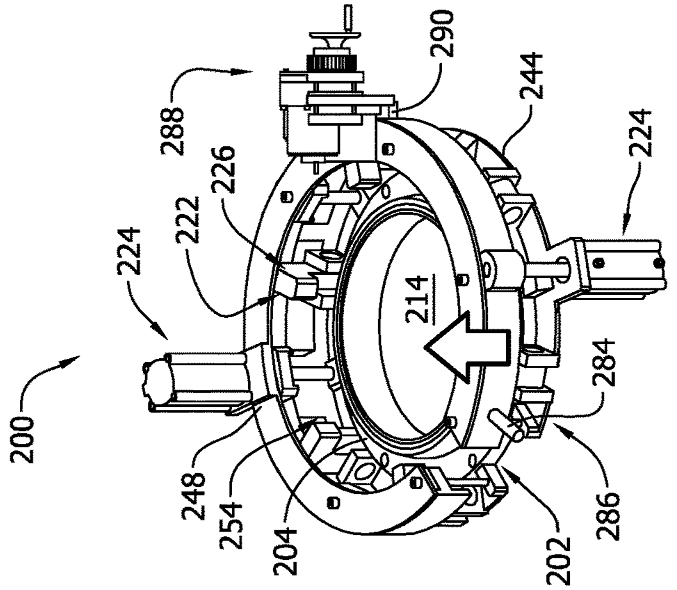
Figure 7:
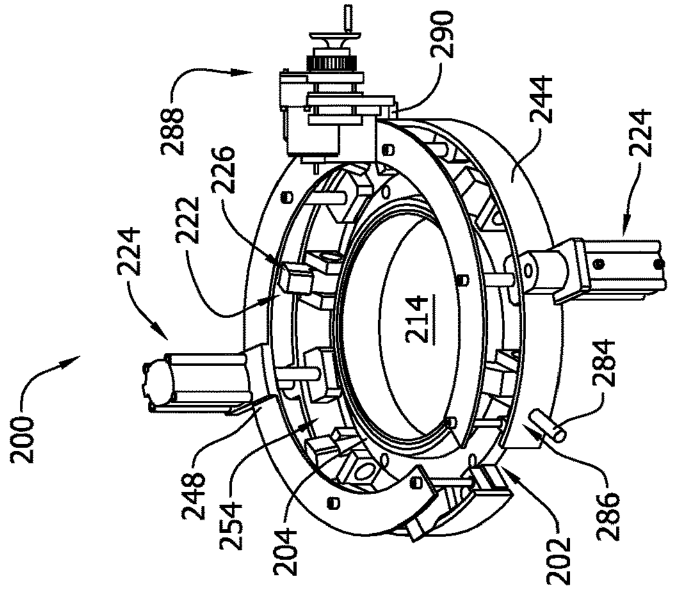

Referring to FIGS. 1-6 and with additional reference to FIGS. 7-9, operation of the clamp 200 for releasably connecting the first vessel end 166 of the ingot receiving vessel 160 to the second valve end 156 of the isolation valve 150 will now be described. FIGS. 7 and 8 are isolated perspectives of the clamp 200 and respectively illustrate steps in a sequence of moving the clamping mechanism 222 of the clamp 200 between a releasing position (FIG. 7, also shown in FIG. 4) and a clamping position (FIG. 8, also shown in FIG. 3). FIG. 9 is an isolated perspective of the clamp 200 and illustrates a step in the sequence of FIGS. 7 and 8 in which the retaining pin assembly 288 is used to maintain the clamping mechanism 222 in the clamping position. The clamp housing 250 is omitted from FIGS. 7-9 to illustrate the operation of the clamp 200.

In operation, the clamp base 202 of the clamp 200 is initially connected to the second valve end 156 of the isolation valve 150, and the first vessel end 166 of the ingot receiving vessel 160 is received by the clamp opening 254. The o-ring 186 provided between the bottom surface 206 of the clamp base 202 and the flange 176 of the second valve end 156 creates a seal therebetween. When the first vessel end 166 is received by the clamp opening 254 and supported on the clamp base 202, the annular wall 212 of the clamp base is received by the rim 188 of the first vessel end 166, and the upper edge 216 of the annular wall 212 engages the interior ledge 196 of the ingot receiving vessel 160. The o-ring 220 provided between the upper edge 216 of the annular wall 212 and the interior ledge 196 creates a seal therebetween. The seals created by the o-rings 186 and 220 facilitate preventing process gases and other reaction byproducts from escaping the interior channel formed by the valve passageway 158, the central opening 214 of the clamp 200, and the ingot receiving chamber 162.

When the first vessel end 166 is received by the clamp opening 254, the clamping mechanism 222 is in the releasing position (FIGS. 4 and 7) to provide clearance for the rim 188 of the first vessel end 166 to reach and be seated on the top surface 208 of the clamp base 202. When the clamping mechanism 222 is in the releasing position, the support ring 244 is in the first position adjacent the clamp base 202 and the clamping fingers 226 are oriented in the idle position as shown in FIGS. 4 and 7 such that the heads 232 of the clamping fingers 226 do not interfere with downward movement of the first vessel end 166 towards the clamp base 202. The clamping fingers 226 are suitably maintained in the idle position by the spring clips 242.

When the first vessel end 166 is seated on the top surface 208 of the clamp base 202, the clamping mechanism 222 may be moved to the clamping position (FIGS. 3 and 8) to connect the first vessel end 166 to the clamp base 202. To move the clamping mechanism 222 to the clamping position, the support ring 244 is moved (e.g., raised) along the guide rails 246 towards the second position in the direction of the longitudinal axis X adjacent the clamp cover 248. The support ring 244 may be moved towards the second position via the controller 140 that controls the pistons 280 of the pneumatic cylinders 224 to move the support ring 244 towards the clamp cover 248.

Additionally or alternatively, the support ring 244 may be manually moved towards the second position by an operator using the outward-extending bars 284. As the support ring 244 is moved towards the second position, the angle surfaces 270 of the support ring 244 respectively engage the back surfaces 266 of the clamping fingers 226 to urge the clamping fingers 226 to pivot towards the engaging position, and the inner surface 258 of the support ring 244 subsequently engages the flat surface portion of the back surfaces 266 of the clamping fingers 226. When the clamping fingers 226 are in the engaging position, the outward-protruding head 232 of each clamping finger 226 extends over and engages the exterior surface 196 to connect the first vessel end 166 to the clamp base 202 and limit or prevent release of the ingot receiving vessel 160 from the clamp 200. When the support ring is in the first position, the engagement between the inner surface 258 of the support ring 244 and the flat surface portion of the back surfaces 266 of the clamping fingers 226 limits or prevents the clamping fingers 226 from pivoting out of engagement with the exterior surface 196 and towards the idle position.

The retaining pin assembly 288 may subsequently engage the support ring 244 (FIG. 9) to maintain the support ring 244 in the second position. The retaining pin 290 is translated towards and into one of the windows 264 of the support ring 244 to limit or prevent the support ring 244 from moving (i.e., lowering) to the first position. Translational movement of the retaining pin 290 into the one of the windows 264 may be caused by operation of the motor 294 controlled by the controller 140 and/or by operation of the manual gear drive 296 by an operator. By maintaining the support ring 244 in the second position, the retaining pin assembly 288 facilitates maintaining the clamping fingers 226 in the engaging position and, thereby, maintaining the clamping mechanism in the clamping position to connect the first vessel end 166 to the clamp base 202.

With the first vessel end 166 connected to the clamp base 202 (shown in FIG. 4), an ingot growth process may proceed as described above. The isolation valve 150 is opened to provide communication between the growth chamber 108 and the ingot receiving chamber 162. A growing ingot may be pulled in the direction of the longitudinal axis X through the growth chamber 108, the valve passageway 158, the central opening 214, the clamp opening 254, and finally into the ingot receiving chamber 162. After the ingot growth process, the isolation valve 150 may be closed to isolate the growth chamber 108 and the ingot receiving vessel 160 may be released from the clamp 200 to enable the fully grown ingot to be subsequently removed from the ingot receiving chamber 162. To facilitate releasing the ingot receiving vessel 160 from the clamp 200, the retaining pin 290 is moved out from the one of the windows 264 of the support ring 244 (e.g., using the motor 294 controlled by the controller 140 and/or using the manual gear drive 296) and the support ring 244 is moved (e.g., lowered) to the second position (e.g., using the pneumatic cylinders 224 controlled by the controller 140 and/or manually using the bars 284). When the support ring 244 is moved to the second position, the spring clips 242 urge the clamping fingers 226 to pivot towards the idle position, in which the heads 232 are out of engagement with the exterior surface 196 and do not interfere with upward movement of the first vessel end 166. The ingot receiving vessel 160 may then be released from the clamp base 202 (e.g., by an upward pulling force applied to the ingot receiving vessel 160).

Advantageously, examples described in this disclosure include a clamp for selectively connecting and releasing an ingot receiving vessel to and from an isolation valve in an apparatus used to produce a single crystal semiconductor ingot. An example clamp is equipped for automated control of the connecting and releasing operations. The automated control of the clamp facilitates reducing or eliminating operator error in installing the clamp and/or creates the opportunity for a fully automated ingot growth process using the apparatus. The clamp also includes components that enable manual operation of the clamp in the event of controller error or outage.

The clamp may also facilitate creating a seal between the ingot receiving vessel and the isolation valve to limit or prevent process gases and other reaction by products from escaping the apparatus. Although the clamp is described for use in apparatus for single crystal ingot growth processes, the clamp may be implemented in additional and/or alternative applications as well.

The terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", "horizontal", "vertical", "lateral", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. An ingot puller apparatus for producing a single crystal semiconductor ingot, the ingot puller apparatus comprising:

a housing defining a growth chamber and a growth chamber outlet;

an isolation valve having a first valve end connected to the growth chamber outlet and an opposite second valve end;

an ingot receiving vessel defining an ingot receiving chamber and a receiving chamber inlet at a receiving vessel end;

a clamp including a clamp base connected to the second valve end, a clamping mechanism to releasably connect the receiving vessel end to the clamp base, and at least one actuator controllable to cause movement of the clamping mechanism between a clamping position in which the clamping mechanism connects the receiving vessel end to the clamp base, and a releasing position in which the receiving vessel end is releasable from the clamp base; and a controller connected to the at least one actuator to control the at least one actuator to cause movement of the clamping mechanism between the clamping and releasing positions;

wherein the clamping mechanism comprises at least one clamping finger pivotably connected to the clamp base and a support ring moveable relative to the clamp base between a first position in which the clamping mechanism is in the releasing position, and a second position in which the clamping mechanism is in the clamping position, the at least one actuator controllable to cause movement of the support ring between the first and second positions, wherein the support ring urges the at least one clamping finger to pivot into engagement with the receiving vessel end when the support ring moves from the first position to the second position.

2. The ingot puller apparatus of claim 1, wherein the at least one clamping finger comprises two or more clamping fingers pivotably connected to the clamp base.

3. The ingot puller apparatus of claim 1, wherein the at least one clamping finger comprises six clamping fingers pivotably connected to the clamp base.

4. The ingot puller apparatus of claim 1, wherein the clamp comprises at least one biasing element that urges the at least one clamping finger to pivot out of engagement with the receiving vessel end when the support ring moves from the second position to the first position.

5. The ingot puller apparatus of claim 1, wherein the clamp comprises a retaining pin for selectively maintaining the support ring in the second position.

6. The ingot puller apparatus of claim 5, wherein the retaining pin is operably connected to a motor that causes translational movement of the retaining pin to selectively maintain the support ring in the second position, the motor connected to the controller.

7. The ingot puller apparatus of claim 1, wherein the at least one actuator comprises a pneumatic cylinder.

8. An ingot puller apparatus for producing a single crystal semiconductor ingot, the ingot puller apparatus comprising:

a housing defining a growth chamber and a growth chamber outlet;

an isolation valve having a first valve end connected to the growth chamber outlet and an opposite second valve end;

an ingot receiving vessel defining an ingot receiving chamber and a receiving chamber inlet at a receiving vessel end; and a clamp including a clamp base connected to the second valve end, at least one clamping finger to releasably connect the receiving vessel end to the clamp base, the at least one clamping finger pivotably connected to the clamp base, and a support ring moveable relative to the clamp base between a first position and a second position, wherein the support ring urges the at least one clamping finger to pivot into engagement with the receiving vessel end when the support ring moves from the first position to the second position to connect the receiving vessel end to the clamp base.

9. The ingot puller apparatus of claim 8, wherein the clamp comprises at least one biasing element that urges the at least one clamping finger to pivot out of engagement with the receiving vessel end when the support ring moves from the second position to the first position.

10. The ingot puller apparatus of claim 8, wherein the clamp comprises at least one actuator controllable to cause movement of the support ring between the first position and the second position.

11. The ingot puller apparatus of claim 10, wherein the at least one actuator comprises a pneumatic cylinder.

12. The ingot puller apparatus of claim 8, wherein the clamp comprises at least one bar extending outward from the support ring to enable an operator to manually move the support ring between the first position and the second position.

13. The ingot puller apparatus of claim 8, wherein the clamp comprises a clamp cover opposite the clamp base, the clamp cover defining an opening sized to receive the receiving vessel end, and guide rails extending between the clamp base and the clamp cover, wherein the support ring is moveable along the guide rails between the first position, in which the support ring is adjacent the clamp base, and the second position, in which the support ring is adjacent the clamp cover.

14. The ingot puller apparatus of claim 8, wherein the clamp base has a surface on which the receiving vessel end is seated when connected to the clamp base and an o-ring that creates a seal between the surface of the clamp base and the receiving vessel end.

15. The ingot puller apparatus of claim 8, wherein the clamp comprises a retaining pin for selectively maintaining the support ring in the second position.

16. The ingot puller apparatus of claim 15, wherein the retaining pin is operably connected to a motor that causes translational movement of the retaining pin to selectively maintain the support ring in the second position.

17. The ingot puller apparatus of claim 15, wherein the retaining pin is operably connected to a manual gear drive to enable an operator to manually cause translational movement of the retaining pin to selectively maintain the support ring in the second position.

18. A releasable clamp for releasably connecting an ingot receiving vessel of an ingot puller apparatus to an isolation valve, the releasable clamp comprising:

a clamp base connectable with an end of the isolation valve;

a clamp cover opposite the clamp base, the clamp cover defining an opening sized for receiving an end of the ingot receiving vessel;

clamping fingers pivotably connected to the clamp base;

a support ring moveable relative to the clamp base between a first position and a second position, wherein the support ring urges the clamping fingers to pivot into an engaging position adapted for connecting the end of the ingot receiving vessel to the clamp base when the support ring moves from the first position to the second position; and at least one actuator controllable to move the support ring between the first and second positions.

19. The releasable clamp of claim 18, wherein the releasable clamp includes biasing elements for each clamping finger, each biasing element urges the respective clamping finger to pivot out of the engaging position when the support ring moves from the second position to the first position.

* * * * *